United States Patent
Okagawa et al.

(10) Patent No.: US 6,938,238 B2
(45) Date of Patent: Aug. 30, 2005

(54) METHOD OF MANUFACTURING ELECTRONIC DEVICE

(75) Inventors: Takashi Okagawa, Tokyo (JP); Tetsuya Yamada, Tokyo (JP); Atsushi Ueno, Tokyo (JP); Atsumi Yamaguchi, Tokyo (JP); Kouichirou Tsujita, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 276 days.

(21) Appl. No.: 10/360,860

(22) Filed: Feb. 10, 2003

(65) Prior Publication Data

US 2004/0054981 A1 Mar. 18, 2004

(30) Foreign Application Priority Data

Sep. 12, 2002 (JP) ........................................ 2002-266742

(51) Int. Cl.[7] .............................................. G06F 17/50
(52) U.S. Cl. ............................................ 716/19; 716/21
(58) Field of Search .................. 7161/19–21; 430/5; 438/639, 647, 657

(56) References Cited

U.S. PATENT DOCUMENTS 6,221,567 B1 * 4/2001 Beilin et al. ................. 430/323
6,500,756 B1 * 12/2002 Bell et al. .................... 438/639

FOREIGN PATENT DOCUMENTS

JP 2001-308076 11/2001

OTHER PUBLICATIONS

M. Neisser, et al., Proc. of SPIE, vol. 3334, pp. 372–383, "Simulation and Experimental Evaluation of Double Exposure Techniques", 1998.

A. Yamaguchi, et al., Proc. of SPIE, vol. 4345, pp. 655–664, "AR Ion Implantation into Resist for Etching Resistance Improvement", 2001.

* cited by examiner

Primary Examiner—Stacy A. Whitmore
Assistant Examiner—Paul Dinh
(74) Attorney, Agent, or Firm—Oblon, Spivak, McClelland, Maier & Neustadt, P.C.

(57) ABSTRACT

In a method of forming a circuit pattern including fine pattern features and fine space, a hard mask layer is patterned with a first pattern defined by eliminating the fine space for merging the pattern features. Thereafter the hard mask layer is shrank. Next, the hard mask layer is patterned with a second pattern that is defined on the basis of the fine space. Finally, the circuit pattern is formed in an underlying layer using the hard mask layer as a mask.

3 Claims, 20 Drawing Sheets

METHOD OF MANUFACTURING ELECTRONIC DEVICE

BACKGROUND OF THE INVENTION

1. Field of the Invention

The present invention relates to a method of manufacturing an electronic device. More particularly, it relates to a method of forming a circuit pattern including fine pattern features and fine space defined between the pattern features.

2. Description of the Background Art

As a technique for forming a circuit pattern on an underlying layer (the layer which is ultimately patterned), lithography is generally employed.

According to the lithography technique generally employed, a photoresist provided on the underlying layer is exposed by reduction projection exposure through a reticle which is used with a stepper. As a result, a resist pattern defined on the basis of circuit design is formed in the photoresist, and thereafter, a circuit pattern is formed in the underlying layer using the patterned photoresist as a mask.

In the present invention, a pattern including pattern features for interconnect and the like, and space therebetween, is collectively referred to as a circuit pattern.

As another background technique for forming a finer pattern than that obtained only by the foregoing lithography, pattern shrinkage process has been employed.

The pattern shrinkage process includes shrinkage for shrinking a patterned photoresist (hereinafter referred to as a first shrinkage technique), and shrinkage for shrinking a patterned hard mask (hereinafter referred to as a second shrinkage technique). The details of the first and second shrinkage techniques are given below.

According to the first shrinkage technique, ion implantation, EB (electron beam) curing (hereinafter simply referred to as cure), UV (ultraviolet) cure, high temperature bake (thermal processing), or the like, is performed on the resist pattern of a predetermined configuration, whereby the resist pattern is shrank. Thereafter etching is performed using the shrank pattern as a mask, to form a finer pattern on the underlying layer.

By way of example, a gate electrode of a transistor is formed by the first shrinkage technique, the detail of which will be described.

First, an electronic device on the way to completion is prepared, whose cross section is as illustrated in FIG. 38. The electronic device illustrated in FIG. 38 includes, from the bottom in plan view, an active layer 5, a gate oxide film 6, a gate electrode layer 7, and a photoresist 8 stacked in this order.

Next, as illustrated in FIGS. 39 and 40, a circuit pattern is formed in the photoresist 8 by lithography. FIG. 39 is a plan view of the electronic device at this stage. As shown in FIG. 39, the circuit pattern formed in the photoresist 8 includes pattern features 1 for gate electrode, pattern features 2 for bonding pad (hereinafter referred to as pattern features 2 for pad) connected to the pattern features 1 for gate electrode, space 3 defined between the pattern features 1, space 4 defined between the pattern features 2, and the like. A cross section thereof taken along a cutting line X—X in FIG. 39 is illustrated in FIG. 40.

Thereafter, shrinkage using the process such as ion implantation or EB cure is performed on the patterned photoresist 8, whereby the pattern features 1 and the pattern features 2 constituting the circuit pattern are shrank as shown in FIGS. 41 and 42. FIG. 41 is a plan view of the electronic device at this stage. A cross section thereof taken along a cutting line X'—X' in FIG. 41 is illustrated in FIG. 42.

Following this, using the shrank photoresist 8 (namely, photoresist including the pattern features 1 and the pattern features 2 after shrinkage) as a mask, etching is performed to define the circuit pattern in the gate electrode layer 7. As a result, gate electrodes 9 and pads 10 are formed. Thereafter the photoresist 8 is removed as shown in FIGS. 43 and 44. FIG. 43 is a plan view of the electronic device at this stage. A cross section thereof taken along a cutting line X"—X" in FIG. 43 is illustrated in FIG. 44.

As described, according to the first shrinkage technique, the photoresist 8 patterned with the circuit pattern is shrank by the process such as ion implantation. Therefore, the pattern features in the photoresist 8 (namely, the features 1 for gate electrode and the features 2 for pad) are finer than those obtained by lithography. As a result, a finer pattern can be formed in the underlying layer (the gate electrode layer 7). Namely, the finer structures of the gate electrodes 9 and the pads 10 can be obtained.

In addition to the shrinkage of the photoresist 8 as described, the foregoing shrinkage process is further advantageous in that the property of the photoresist 8 is altered, leading to improvement in tolerance thereof to etching (namely, the capability to withstand etching).

Considering the improvement in tolerance to etching in advance, it is possible to define the photoresist 8 to have a small thickness, leading to reduction in aspect ratio. As a result, using etching process, formation of the fine pattern in the underlying layer (in the foregoing example, formation of the thinner gate electrode 9 in the gate electrode layer 7) can be facilitated.

Next, the second shrinkage technique using a hard mask will be described in detail.

In the present invention, a hard mask represents a film provided between an underlying layer to be actually patterned with a circuit pattern and a photoresist, and having a higher etch selectivity relative to the underlying layer.

According to the second shrinkage technique, a hard mask is etched using a previously patterned photoresist as a mask, whereby a circuit pattern is formed in the hard mask. Thereafter isotropic etching is performed to shrink the hard mask. Then the hard mask after shrinkage is used as a mask for etching the underlying layer. As a result, a finer circuit pattern can be formed in the underlying layer.

By way of example, a gate electrode of a transistor is formed by the second shrinkage technique, the detail of which will be described.

First, an electronic device on the way to completion is prepared, whose cross section is as illustrated in FIG. 45. The electronic device illustrated in FIG. 45 includes, from the bottom in plan view, the active layer 5, the gate oxide film 6, the gate electrode layer 7, a hard mask layer 11, and the photoresist 8 stacked in this order.

Next, as illustrated in FIGS. 46 and 47, a circuit pattern is formed in the photoresist 8 by lithography. FIG. 46 is a plan view of the electronic device at this stage. As shown in FIG. 46, the circuit pattern formed in the photoresist 8 includes the pattern features 1 for gate electrode, the pattern features 2 for pad, the space 3 defined between the pattern features 1, the space 4 defined between the pattern features 2, and the like. A cross section thereof taken along a cutting line Y—Y in FIG. 46 is illustrated in FIG. 47.

Thereafter, using the photoresist 8 patterned with the circuit pattern (including the pattern features 1 for gate electrode and the pattern features 2 for pad), etching is performed to define the circuit pattern in the hard mask layer 11. Thereafter the photoresist 8 is removed as shown in FIGS. 48 and 49. FIG. 48 is a plan view of the electronic device at this stage. A cross section thereof taken along a cutting line Y'—Y' in FIG. 48 is illustrated in FIG. 49.

Next, isotropic etching is performed to shrink the hard mask layer 11 patterned with the circuit pattern, whereby the pattern features 1 and the pattern features 2 constituting the circuit pattern are shrank as illustrated in FIGS. 50 and 51. FIG. 50 is a plan view of the electronic device at this stage. A cross section thereof taken along a cutting line Y"—Y" in FIG. 50 is illustrated in FIG. 51.

Following this, using the shrank hard mask layer 11 (namely, hard mask layer including the pattern features 1 and the pattern features 2 after shrinkage) as a mask, etching is performed to define the circuit pattern in the gate electrode layer 7. As a result, the gate electrodes 9 and the pads 10 are formed. Thereafter the hard mask layer 11 is removed, whereby the circuit pattern corresponding to that obtained by the first shrinkage technique is formed in the gate electrode layer 7 (FIGS. 43 and 44).

As described, according to the second shrinkage technique, the hard mask layer 11 is added which can be shrank by the simple isotropic etching. Using the hard mask layer 11 after shrinkage as a mask, the gate electrode layer 7 is etched. As a result, the resultant circuit pattern, namely, the pattern including the gate electrodes 9 and the pads 10, is finer than that obtained only by lithography.

The first and second shrinkage techniques are introduced in "Ar ion Implantation into Resist for Etching Resistance Improvement", A. Yamaguchi et al., pp. 655–664, Proc. of SPIE Vol. 4345 (2001), and Japanese Patent Application Laid-Open No. 2001-308076 (pp. 5–6, FIG. 1), for example.

In exposing the photoresist 8 to form a circuit pattern therein, the lithography process finds difficulty in obtaining high resolution of the fine pattern features 1 and that of the fine spaces 3 and 4 defined between the pattern features under the same conditions.

More particularly, favorable conditions of lithography for obtaining high resolution of the fine pattern features 1 are unfavorable for that of the fine spaces 3 and 4. Conversely, favorable conditions of lithography for high resolution of the fine spaces 3 and 4 are unfavorable for that of the pattern features 1.

For example, illumination conditions for exposure exhibiting excellence in resolution of the fine pattern features 1 are likely to degrade the resolution of the fine spaces 3 and 4. As another example, the material for the photoresist 8 exhibiting excellence in resolution of the fine spaces 3 and 4 are likely to degrade the resolution of the fine pattern features 1.

In view of the above, it is found that there is a trade-off between the resolution of the fine pattern features 1, and that of the fine spaces 3 and 4. When the pattern features 1, and the spaces 3 and 4 are to be simultaneously defined, they cannot have their minimum dimensions at the same time, imposing limitation on the shrinkage of the circuit pattern as a whole.

Further, the shrinkage process encounters the problem as given below.

According to the first or second shrinkage technique, the circuit pattern formed in the photoresist 8 or in the hard mask layer 11 is shrank, whereby the pattern features 1 for gate electrode and the pattern features 2 for pad themselves are shrank. On the contrary, the spaces 3 and 4 defined between the pattern features become wider resulting from the shrinkage of the pattern features. Therefore, integration of the circuit pattern cannot be improved.

As seen from the comparison between FIGS. 48 and 50, or between FIGS. 49 and 51, for example, the shrinkage of the pattern features 2 causes expansion of the space 4 therebetween. That is, the pattern shrinkage process achieves no effect on the shrinkage of the circuit pattern as a whole, leading to no improvement in integration of the circuit pattern.

Making allowance for the amount of shrinkage of the pattern features 2, the space 4 between the features 2 may be designed to be smaller than the one between the features 2 to be subjected to no shrinkage. However, even when the space 4 is designed to have a dimension smaller than its minimum possible dimension at the design stage, it cannot be allocated correctly in the photoresist 8 by the conventional lithography technique due to the foregoing trade-off.

SUMMARY OF THE INVENTION

It is therefore an object of the present invention to provide a method of manufacturing an electronic device allowing shrinkage (size reduction) of a circuit pattern as a whole, and eventually, allowing high integration of the electronic device.

According to the present invention, the method of manufacturing an electronic device for defining first and second circuit patterns separated by space includes the following steps (a) through (e). In the step (a), a hard mask layer is provided on an underlying layer. In the step (b), a first pattern is formed in the hard mask layer. The first pattern covers a region for defining the first and second circuit patterns, and a region for defining the space. The step (c) is performed after the step (b). In the step (c), the hard mask layer is shrank. The step (d) is performed after the step (c). In the step (d), a second pattern is formed in the hard mask layer. The second pattern covers the region for defining the first and second circuit patterns, while exposing the underlying layer in the region for defining the space. The step (e) is performed after the step (d). In the step (e), the first and second circuit patterns are defined in the underlying layer using the hard mask layer as a mask.

When lithography is employed in the steps (b) and (d), the hard mask layer is defined to have a relatively small thickness. The lithography processes are performed at separate steps under the conditions defined specialized for the pattern feature and the space, respectively. Therefore, the dimension of the circuit pattern can be smaller than that defined under the limitations of the trade-off in the background art, whereby high integration of the device is achieved. As the hard mask layer patterned with the first patter is shrank, further, the finer circuit pattern can be formed.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
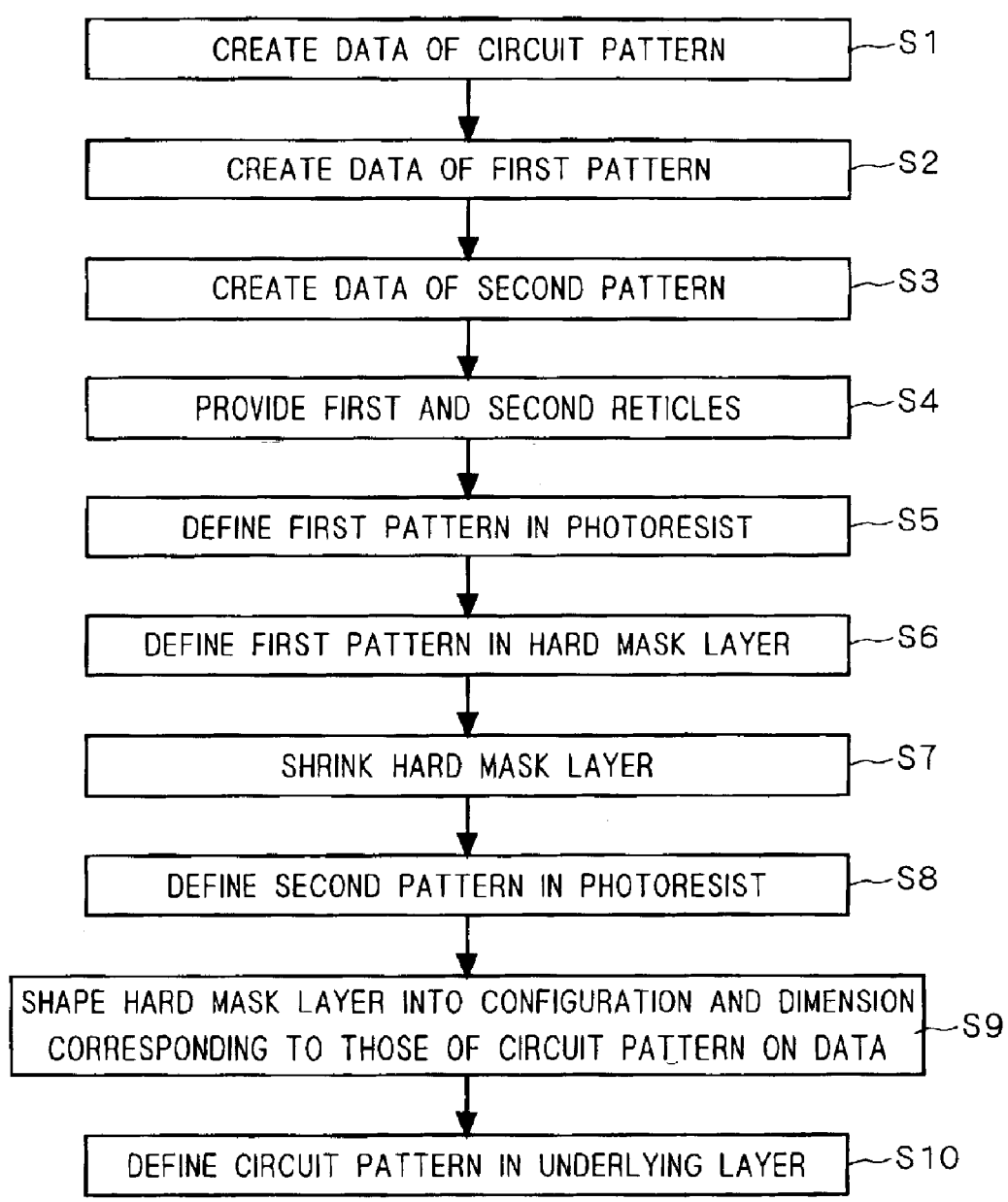
FIG. 1 is a flow chart showing the process flow of a manufacturing method according to a first preferred embodiment of the present invention.

The manufacturing method of the present invention is preferably employed for forming a fine circuit pattern including fine pattern features and fine space each having dimension hardly realized only by the lithography technique.

According to the manufacturing method of the present invention, a hard mask layer is provided on an underlying layer to be actually patterned with a circuit pattern. For forming the fine circuit pattern in this hard mask layer, a first pattern including no fine space is defined first in the hard mask layer. Thereafter, fine space is allocated to the hard mask layer in line with a second pattern that is defined on the basis of the fine pattern.

In the present invention, the first pattern is a provisional pattern formed by arranging new pattern feature in the fine space of the fine circuit pattern between the pattern features, to eliminate the fine space.

The second pattern is formed on the basis of the fine space in the fine circuit pattern between the pattern features. The second pattern is used for generating fine space that is eliminated in the formation of the first pattern.

Further, the hard mask layer is provided between the underlying layer to be actually patterned with the circuit pattern and a photoresist, having an etch selectivity higher than that of the underlying layer.

The preferred embodiments of the present invention will be described below with reference to the pertinent drawings. The same or corresponding elements as those in the background art are designated by the same reference numerals.

First Preferred Embodiment

In the manufacturing method according to the first preferred embodiment of the present invention, the hard mask layer is shrank after formation of the first pattern therein. Thereafter, fine space is allocated to the hard mask layer after shrinkage in line with the second pattern, whereby the fine circuit pattern is formed in the hard mask layer.

With reference to the flow chart shown in FIG. 1, the process flow of the manufacturing method of the first preferred embodiment will be described.

First, pattern data of a circuit pattern including fine pattern features and fine space is produced. The circuit pattern data formed in this step includes first and second circuit patterns separated by fine space (step S1).

Next, in the circuit pattern on data, the pattern features are merged. More particularly, a merging pattern feature is newly arranged in the fine space between the pattern features, whereby these pattern features are merged. As a result, data of a first pattern is created (step S2).

Next, fine space is extracted from the circuit pattern on data, on the basis of which data of a second pattern is created (step S3).

The sequence of the steps S2 and S3 may be arbitrary determined.

Thereafter, first and second reticles are provided on the basis of data of the first and second patterns, respectively (step S4).

A first lithography process is thereafter performed through the first reticle, to form the first pattern in a photoresist (step S5).

Next, using the photoresist patterned with the fist pattern as a mask, anisotropic etching is performed. As a result, the first pattern is defined in a hard mask layer provided under the photoresist. Namely, the first pattern covering a region for defining the first and second circuit patterns, and a region for defining the fine space, is formed in the hard mask layer (step S6).

Subsequent to this, the hard mask layer patterned with the first pattern undergoes isotropic etching, whereby the hard mask layer is shrank (step S7).

Next, another photoresist is provided to cover the hard mask layer after shrinkage. Then a second lithography process is performed through the second reticle, to form the second pattern in this photoresist (step S8).

Subsequently, using the photoresist patterned with the second pattern as a mask, anisotropic etching is performed, whereby the fine space defined in line with the second pattern is allocated to the hard mask layer provided under the photoresist. Namely, the second pattern covering the region for defining the first and second circuit patterns, while exposing the underlying layer in the region for defining the fine space, is formed in the hard mask layer. The resultant configuration and dimension of the hard mask layer are corresponding to those of the circuit pattern on data (step S9).

The last step is etching using the hard mask layer including the circuit pattern therein as a mask, to form the circuit pattern in the underlying layer (step S10).

The process flow of the manufacturing method of the first preferred embodiment is as given above. By way of example, a gate electrode of a transistor is formed by the manufacturing method of the first preferred embodiment, the detail of which will be described.

First, following design process using CAD system, for example, the circuit pattern is formed including the fine pattern features 1 for gate electrode, the pattern features 2 for bonding pad (hereinafter referred to as features 2 for pad) connected to the pattern features 1, the fine space 3 between the pattern features 1, and the fine space 4 between the pattern features 2 (step S1).

The linewidth of the fine pattern feature 1 of the circuit pattern is designed to be smaller than the minimum possible linewidth thereof that is determined under the optimum lithography conditions for its resolution.

The dimension of the fine spaces 3 and 4 (space between the pattern features) are designed to be the same as the respective minimum possible dimensions thereof that are determined under the optimum lithography conditions for their resolutions.

Figure 2:
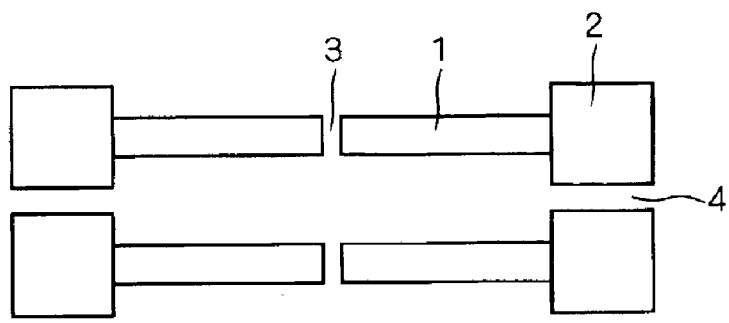
FIG. 2 is a plan view illustrating the configuration of a circuit pattern on data.

Next, a new pattern feature is arranged to the portions corresponding to the fine spaces 3 and 4 in the circuit pattern in FIG. 2, whereby data of the first pattern is created (step S2).

The detail of creation of data of the first pattern is as follows.

Figure 3:
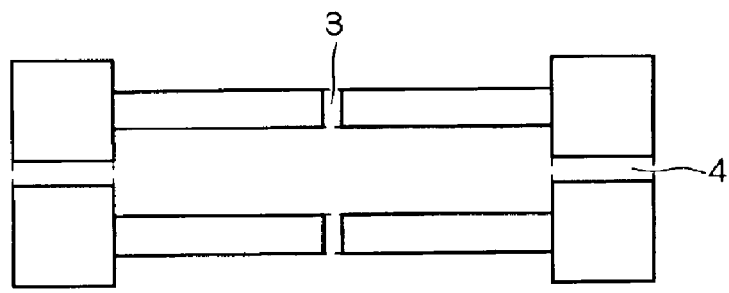
FIG. 3 is a plan view illustrating pattern features to be merged in the circuit pattern on data.

First, a merging pattern feature is newly introduced (arranged) in the portions represented by dotted lines corresponding to the fine spaces 3 and 4 between the pattern features (FIG. 3). Then, the fine pattern features 1 are merged into one, and the pattern features 2 are also merged into one, whereby data of a resultant pattern 12 shown in FIG. 4 is created.

Figure 4:
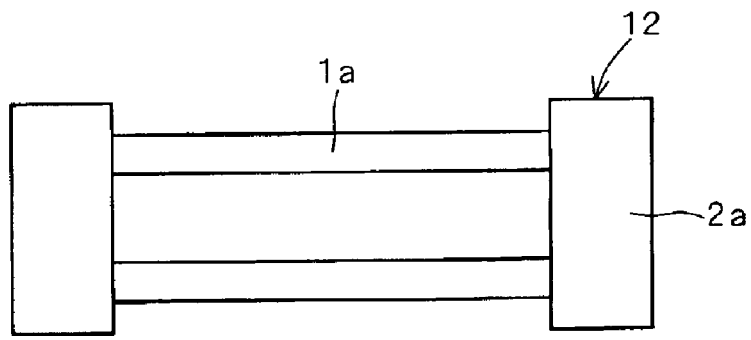
FIG. 4 illustrates the circuit pattern on data formed by eliminating fine space to merge the pattern features.

In FIG. 4, reference numeral 1a represents a merged pattern feature for gate electrode, and 2a represents a merged pattern feature for pad.

When a merging pattern feature is newly given, no linewidth should be smaller than the minimum linewidth of the fine pattern feature 1 shown in FIG. 2, the reason for which will be given later.

Figure 5:
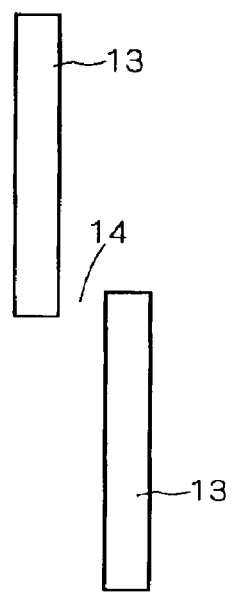
FIGS. 5 and 6 are plan views each showing what should be noticed in merging pattern features on data.
Figure 6:
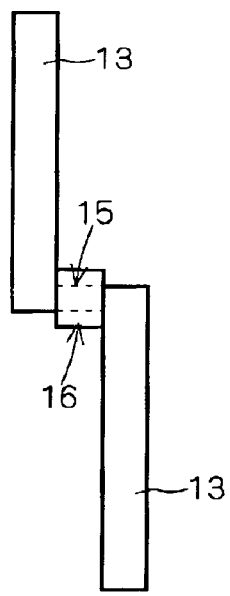

With reference to FIG. 5 by way of example, when a fine space 14 defined between isolated pattern features 13 (each having the minimum possible linewidth determined by the optimum lithography conditions for patterning) is to be eliminated for merging the isolated pattern features 13, a merging pattern feature 15 represented by dotted lines in FIG. 6 should not be introduced having a dimension along a vertical direction in the plane of the drawing that is smaller than the minimum linewidth of the isolated pattern feature 13. Instead, a merging pattern feature 16 represented by solid lines in FIG. 6 should be introduced having a dimension along a vertical direction in the plane of the drawing that is larger than the minimum linewidth of the isolated pattern feature 13.

Returning to the process of the manufacturing method, the pattern 12 on data shown in FIG. 4 is thereafter enlarged uniformly. This enlargement is performed on the basis of the following reason.

As described, the linewidth of the merged pattern feature 1a (or the pattern feature 1) at the design stage is smaller than the minimum possible linewidth thereof that is determined under the optimum lithography conditions specialized for patterning. Therefore, the linewidth at the design stage is unusable for correctly forming the merged pattern feature 1a in the photoresist at the to-be-performed patterning in the first lithography process (step S5).

In view of this, for correctly forming the merged pattern feature 1a in the first lithography process at step S5, the pattern 12 shown in FIG. 4 is uniformly enlarged on data to the extent that the pattern after enlargement can be shrank to its original size by the shrinkage process at step S7.

Figure 7:
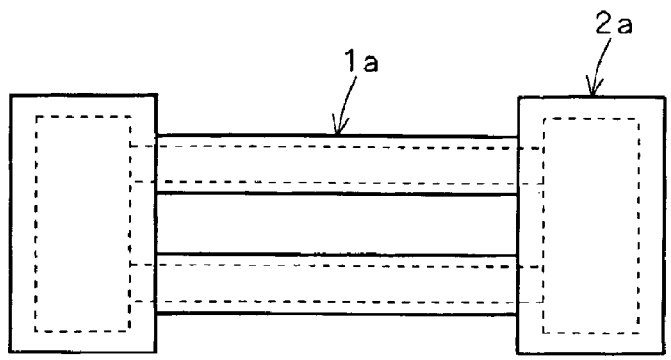
FIG. 7 is a plan view illustrating a first pattern on data.

The pattern shown in FIG. 7 after enlargement on data is the first pattern. In FIG. 7, dotted lines represent the pattern before enlargement.

Next, the fine spaces 3 and 4 are extracted from the circuit pattern shown in FIG. 2. On the basis of the extracted spaces 3 and 4, data of the second pattern is created (step S3).

The detail of creation of data of the second pattern is as follows.

Figure 8:
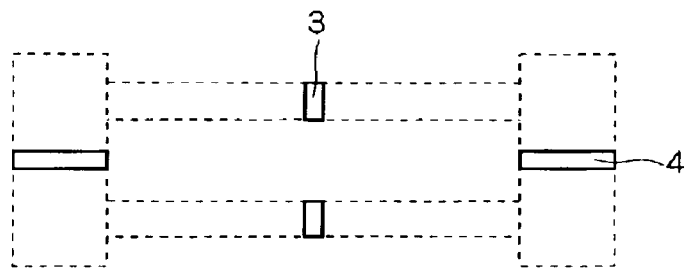
FIG. 8 illustrates the fine space extracted from the circuit pattern on data.

As shown in FIG. 8, the fine spaces 3 and 4 are extracted from the circuit pattern in FIG. 2.

Figure 9:
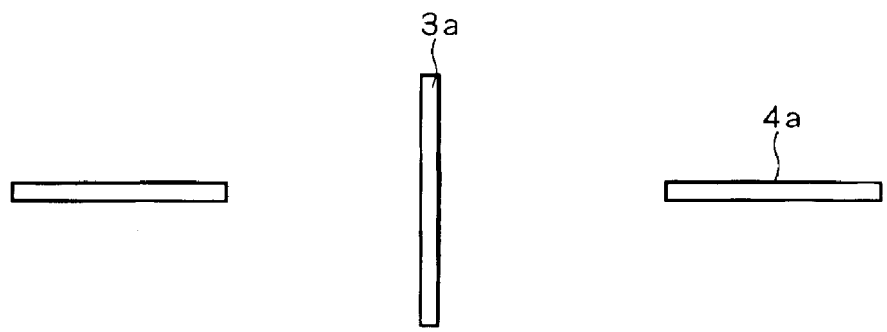
FIG. 9 is a plan view illustrating a second pattern on data.

Next, the fine spaces 3 and 4 are enlarged (extended) as in FIG. 9.

More particularly, the fine space 3 is enlarged (extended) in a direction perpendicular to the lengthwise direction of the pattern feature 1. The fine space 4 is enlarged (extended) in a direction perpendicular to the direction in which the pattern features 2 are arranged with the space 4 interposed therebetween.

The pattern including the enlarged (extended) spaces 3 and 4 shown in FIG. 9 is the second pattern on data. The spaces after enlargement (extension) are represented by reference numerals 3a and 4a.

On the basis of data of the first and second patterns, respectively, the first and second reticles are provided (step S4).

Figure 10:
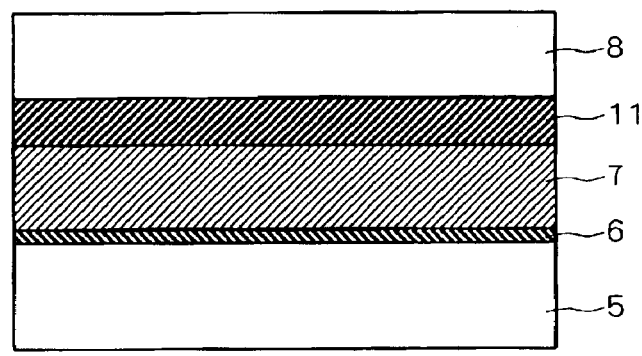
FIG. 10 is a cross-sectional view illustrating the structure of an electronic device to be patterned with a circuit pattern.

Subsequently, the first and second patterns are formed in the hard mask layer. Prior to patterning, an electronic device on the way to completion shown in FIG. 10 is prepared. This electronic device comprises a semiconductor substrate including an underlying layer and a hard mask layer stacked thereon.

More particularly, the electronic device illustrated in FIG. 10 includes, from the bottom, an active layer 5, a gate oxide film 6, a gate electrode layer 7, a hard mask layer 11, and a photoresist 8 stacked in this order.

Thereafter, using the first reticle and a stepper, the first pattern is formed in the photoresist 8 by the first lithography process (step S5).

Figure 11:
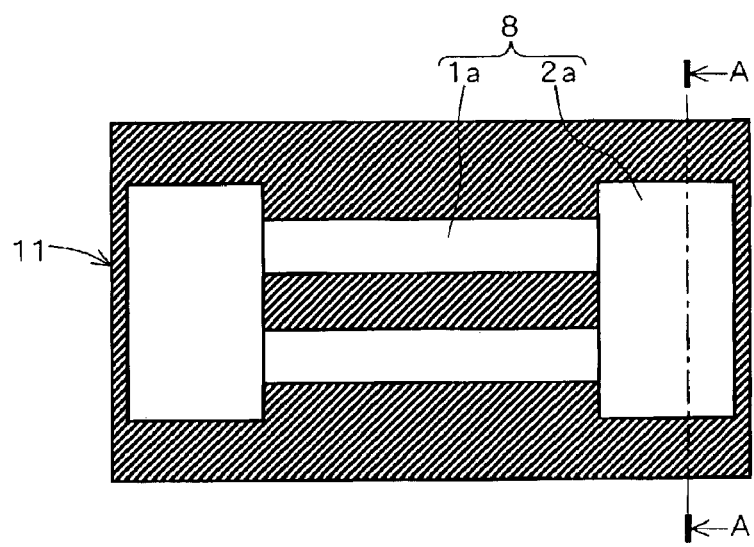
FIG. 11 is a plan view illustrating a photoresist patterned with the first pattern.
Figure 12:
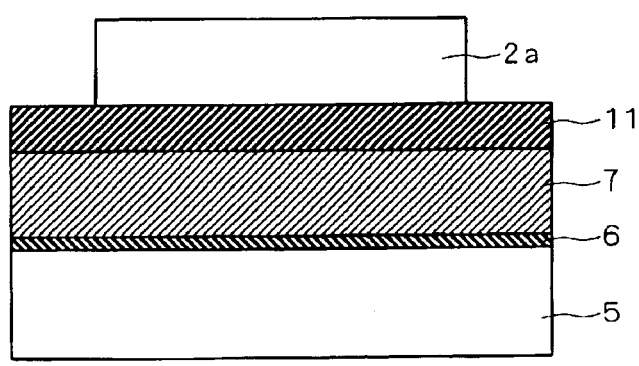
FIG. 12 is a cross-sectional view illustrating the photoresist patterned with the first pattern.

FIG. 11 is a plan view illustrating how the first pattern is formed. A cross section thereof taken along a cutting line A—A in FIG. 11 is illustrated in FIG. 12.

As seen from the foregoing description of step S2, the first pattern on data is the result of enlargement. Therefore, the merged pattern feature 1a can be correctly formed.

As seen from the foregoing description of step S2 (more particularly, description with reference to FIGS. 5 and 6), further, the addition of the merging pattern feature generates no linewidth that is smaller than the minimum linewidth of the pattern feature 1 shown in FIG. 2. Therefore, the merging pattern feature newly introduced in the design stage can be formed by the first lithography process.

Still further, the first pattern includes no fine spaces 3 and 4. Therefore, the first lithography process can be performed under the specialized conditions for the fine pattern features.

As the conditions the first lithography process specialized for the fine pattern features, deformed illumination such as zonal illumination or quadrupole illumination may be employed. Alternatively, the material for the photoresist 8 may be so selected that it is directed specifically to the formation of the pattern features.

In the background art, there is a trade-off between the resolution of the fine pattern feature and that of the fine space. When the fine pattern feature and the fine spaces are to be simultaneously defined, they cannot have their minimum dimensions at the same time. In contrast, according to the foregoing first lithography process, only the fine pattern feature (the merged pattern feature 1a for gate electrode) is defined. It is thus possible to select the conditions specialized for the fine pattern feature, whereby the dimension of the pattern feature can be smaller than the minimum dimension thereof that is defined under the limitations of the foregoing trade-off.

Returning to the process of the manufacturing method of the first preferred embodiment, using the photoresist 8 patterned with the first pattern as a mask, anisotropic etching is performed to form the first pattern in the hard mask layer (step S6).

Figure 13:
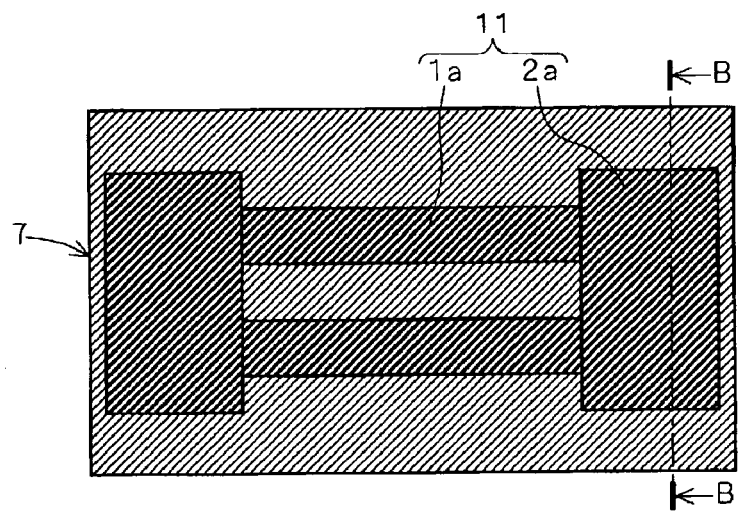
FIG. 13 is a plan view illustrating a hard mask layer patterned with the first pattern.
Figure 14:
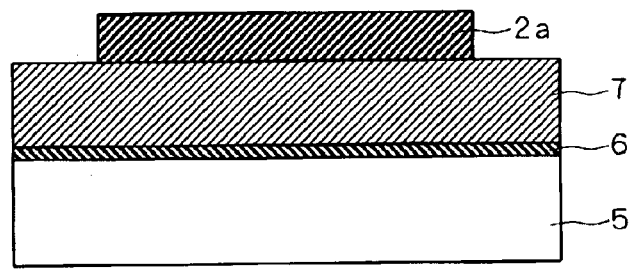
FIG. 14 is a cross-sectional view illustrating the hard mask layer patterned with the first pattern.

FIG. 13 is a plan view of the electronic device after removal of the photoresist 8 by this anisotropic etching. A cross section thereof taken along a cutting line B—B in FIG. 13 is illustrated in FIG. 14.

By way of example, using gas such as $CF_4$, $CHF_3$, Ar, $O_2$, or the like, plasma is generated by high-frequency electromagnetic field in a vacuum chamber, whereby anisotropic etching is performed on the hard mask layer 11.

Next, isotropic etching (such as liquid phase etching) is performed on the hard mask layer 11 patterned with the first pattern, to isotropically shrink the first pattern (step S7).

Figure 15:
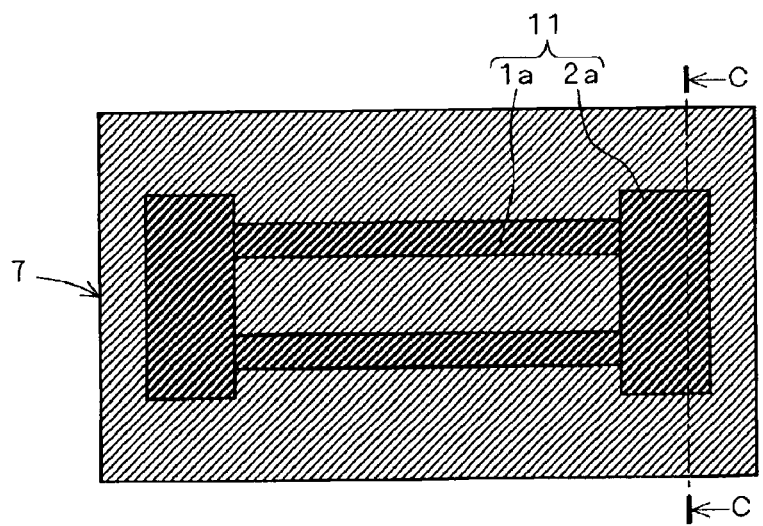
FIG. 15 is a plan view illustrating the hard mask layer patterned with the first pattern after shrinkage.
Figure 16:
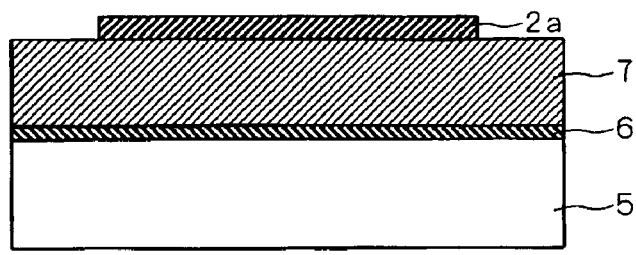
FIG. 16 is a cross-sectional view illustrating the hard mask layer patterned with the first pattern after shrinkage.

FIG. 15 is a plan view of the electronic device at this stage. A cross section thereof taken along a cutting line C—C in FIG. 15 is illustrated in FIG. 16. In order to form the pattern feature such as feature for gate electrode in the electronic device to be provided with a dimension intended at the design stage, the amount of shrinkage should be approximately the same as the amount of enlargement at step S2.

The material for the hard mask layer 11 may be selected in consideration of the following characteristics. That is, in addition to higher etch selectivity in anisotropic etching relative to the gate electrode layer 7 as discussed, the material for the hard mask layer 11 may have etch selectivity in isotropic etching lower than that of the gate electrode layer 7. For example, when the gate electrode layer 7 is made of polysilicon, the hard mask layer 11 may be made of silicon oxide or silicon nitride, whereby these selectivities can be satisfied.

When the material for the hard mask layer 11 bears these characteristics, the conditions for isotropic etching for shrinking the hard mask layer 11 including the first pattern therein are defined. In this isotropic etching, it is thus allowed to suppress the degree of etching to the gate electrode layer 7. As a result, the degree of influence to be exerted on the gate electrode layer 7 by this isotropic etching can be minimized.

The exemplary conditions for isotropic etching include hydrofluoric acid solution having a concentration of 0.25%. When the electronic device at the stage of FIGS. 13 and 14 is immersed in this solution for about 180 seconds, and when the hard mask layer 11 includes silicon oxide, the hard mask layer 11 is isotropically shrank by about 30 nm. When the gate electrode layer 7 includes polysilicon, it is hardly subjected to this isotropic etching using hydrofluoric acid.

Resulting from this isotropic etching, the hard mask layer 11 is shrank in the direction of the thickness thereof as well as in the lateral direction. Therefore, in consideration of the amount of shrinkage by this isotropic etching and further, in consideration of the thickness usable as a mask in anisotropic etching at later step S10 for forming a circuit pattern in the gate electrode layer 7, the original thickness of the hard mask layer 11 should be designed.

After shrinkage of the first pattern formed in the hard mask layer 11, another photoresist 18 is provided on the hard mask layer 11. Next, in order to allocate the fine spaces 3 and 4 to the first pattern after shrinkage, the second pattern including the fine spaces 3a and 4a is formed in the photoresist 18 by the second lithography process using the second reticle and a stepper (step S8).

Figure 17:
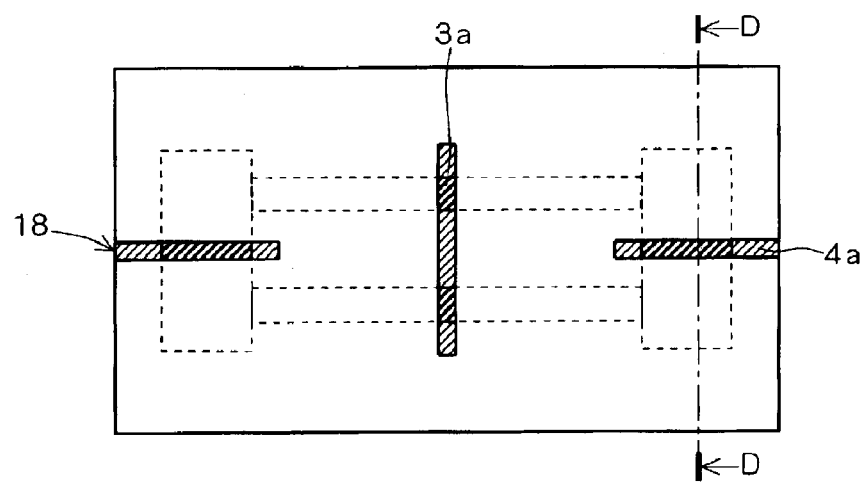
FIG. 17 is a plan view illustrating a photoresist patterned with the second pattern.
Figure 18:
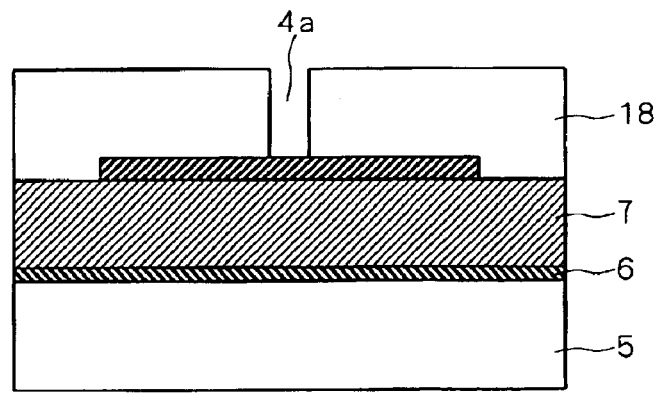
FIG. 18 is a cross-sectional view illustrating the photoresist patterned with the second pattern.

FIG. 17 is a plan view of the electronic device at this stage. A cross section thereof taken along a cutting line D—D in FIG. 17 is illustrated in FIG. 18. Dotted lines in FIG. 17 represent the first pattern after shrinkage formed under the photoresist 18.

As seen from FIGS. 17 and 18, the portions of the photoresist 18 on the hard mask layer 11 corresponding to the fine spaces 3 and 4 defined in the circuit pattern shown in FIG. 2 are removed. At these portions, the hard mask layer 11 is exposed to show the contour of the first pattern.

The second pattern only includes the fine spaces 3a and 4a for defining the fine spaces 3 and 4. Namely, the second pattern does not include the pattern feature such as the one for gate electrode. Therefore, patterning in the second lithography process can be performed under the conditions specialized for the fine space.

As the conditions for the second lithography process specialized for the fine space, small sigma illumination may be employed. Alternatively, the material for the photoresist 18 may be so selected that it is directed specifically to the formation of the fine space.

In the background art, there is a trade-off between the resolution of the fine pattern feature and that of the fine space. When the fine pattern feature and the fine space are to be simultaneously defined, they cannot have their minimum dimensions at the same time. In contrast, according to the second lithography process, only the fine spaces 3a and 4a (namely, fine spaces 3 and 4) are defined. It is thus possible to select the conditions specialized for the fine space, whereby the dimension of the space can be smaller than the minimum dimension thereof that is defined under the limitations of the foregoing trade-off.

Returning to the process of the manufacturing method, using the photoresist 18 patterned with the second pattern as a mask, anisotropic etching is performed to form the second pattern in the hard mask layer 11 under the photoresist 18 and having the first pattern therein. That is, a pattern including the first pattern and the fine spaces 3, 4 is defined in the hard mask layer 11. As a result, the resultant configuration and dimension of the hard mask layer 11 are corresponding to those of the circuit pattern on data (step S9).

Figure 19:
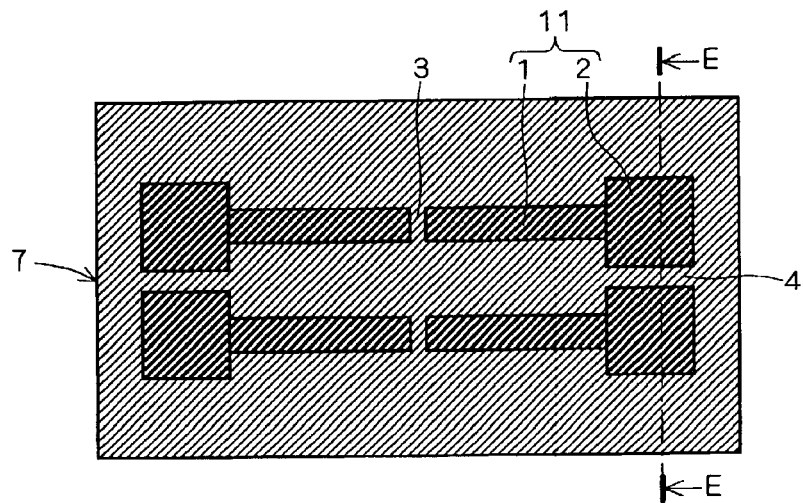
FIG. 19 is a plan view illustrating the hard mask layer patterned with the circuit pattern.
Figure 20:
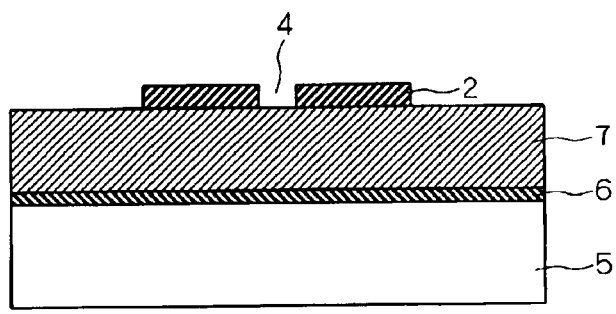
FIG. 20 is a cross-sectional view illustrating the hard mask layer patterned with the circuit pattern.

FIG. 19 is a plan view of the electronic device after removal of the photoresist 18 by this anisotropic etching. A cross section thereof taken along a cutting line E—E in FIG. 19 is illustrated in FIG. 20.

As discussed, the second pattern is defined for forming the fine spaces 3 and 4 in the first pattern. For reliably forming the fine spaces 3 and 4, enlargement (extension) process at step S3 is effective.

That is, even when the second pattern to be formed on the first pattern deviates from its proper position to some degree, the fine spaces 3 and 4 can be reliably formed owing to the margin generated by this enlargement (extension).

The anisotropic etching for forming the second pattern may be performed under the same conditions as those for anisotropic etching at step S6, for example.

Returning to the process of the manufacturing method, using the hard mask layer 11 as a mask including the pattern therein defined by the steps described so far, anisotropic etching is performed to form the circuit pattern in the gate electrode layer 7 as an underlying layer. Namely, gate electrodes 9 and pads 10 are formed (step S10).

Figure 21:
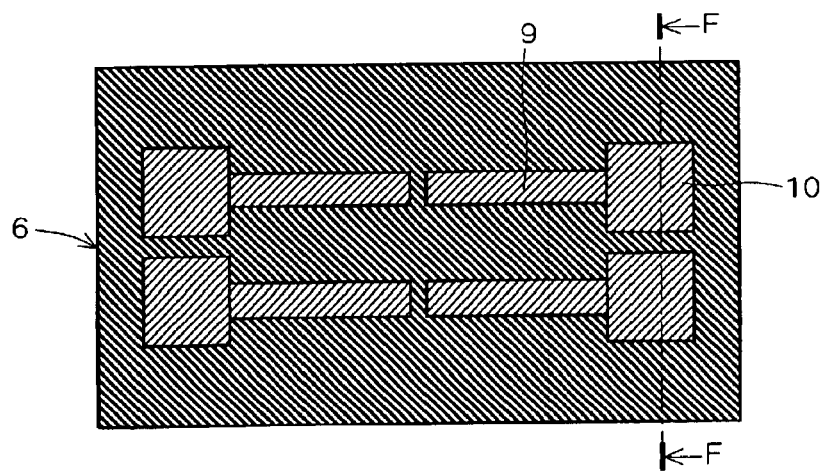
FIG. 21 is a plan view illustrating gate electrodes and pads that are formed in conformity with the circuit pattern on data.

FIG. 21 is a plan view of the electronic device after removal of the hard mask layer 11 by this anisotropic etching. A cross section thereof taken along a cutting line F—F in FIG. 21 is illustrated in FIG. 22.

Figure 22:
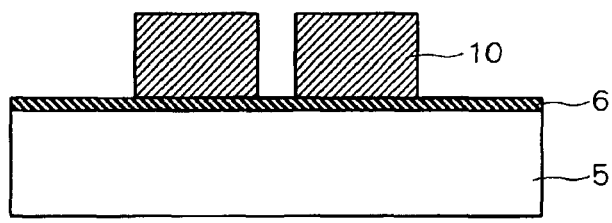
FIG. 22 is a cross-sectional view illustrating the gate electrodes and the pads that are formed in conformity with the circuit pattern on data.

As described, when the gate electrode layer 7 is made of polysilicon and the hard mask layer 11 is made of silicon oxide, this anisotropic etching resulting in FIGS. 21 and 22 may be performed by generating plasma by high-frequency electromagnetic field in a vacuum chamber using gas such as $HBr$, $Cl_2$, $O_2$, or the like. As a result, the hard mask layer 11 is scarcely etched. That is, the hard mask layer 11 is allowed to have a higher etch selectivity relative to the gate electrode layer 7.

As given in the foregoing description, in the manufacturing method of the first preferred embodiment, the first lithography process for forming the first pattern including no fine space, and the second lithography process for forming the second pattern including the fine space, are performed at completely separate steps.

This characteristic of the first preferred embodiment results from the following reason. That is, the hard mask layer 11 is provided on the underlying layer (gate electrode layer) 7, and the hard mask layer 11 undergoes lithography process twice, whereby the circuit pattern is formed therein.

In view of this, the gate electrode layer 7 may be subjected to the lithography process twice in the same manner, which in turn results in the problem as follows.

In this case, the first pattern is formed first in the gate electrode layer 7 by the first lithography process. Next, prior to the second lithography process, the photoresist 18 is provided to cover the gate electrode layer 7 and the gate oxide film 6 (see FIG. 23).

Figure 23:
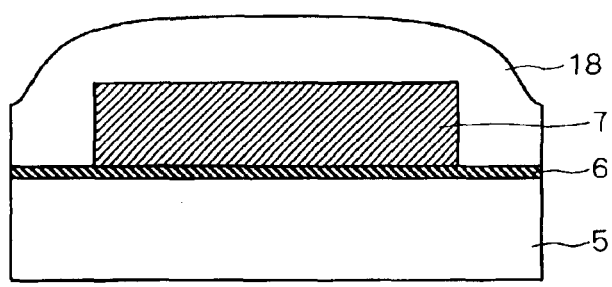
FIG. 23 shows the difficulty in lithography caused by step height.

Thereafter, the electronic device shown in FIG. 23 undergoes the second lithography process. As seen from the configuration of the second pattern, the resultant second pattern extends over the gate electrode layer 7 and the gate oxide film 6 (see FIG. 17).

Even when a photoresist is provided on the structure having step height and a pattern is defined in this photoresist, the lithography process generally encounters the problem that the pattern cannot be formed correctly as the degree of step height becomes larger.

Even when the structure shown in FIG. 23 undergoes the second lithography process, it results that the second pattern cannot be defined correctly due to the large thickness of the gate electrode layer 7.

In view of this, the hard mask layer 11 having a higher etch selectivity relative to the underlying layer 7 is provided. The hard mask layer 11 is allowed to have a small thickness owing to its high etch selectivity. More particularly, the thickness of the hard mask layer 11 can be sufficiently smaller than that of the gate electrode layer 7. Therefore, the foregoing problem resulting from the step height can be avoided (see FIGS. 18 and 23).

By providing the hard mask layer 11 on the underlying layer 7, it is allowed to employ the foregoing first and second lithography processes. Further, these lithography processes are performed under the conditions specialized for the fine pattern feature and fine space, respectively. Therefore, the dimension of the fine pattern feature and of the fine space can be smaller than those defined under the limitations of the trade-off in the background art. As a result, shrinkage of the circuit pattern as a whole is allowed, leading to improvement in integration of the device.

Still further, in the first preferred embodiment, the hard mask layer 11 is shrank after the first lithography process, and thereafter, the second lithography process is performed. Therefore, shrinkage of the pattern features causes no effect on the fine spaces 3 and 4 between the pattern features. As a result, expansion of the fine spaces 3 and 4 referred to in the description of the background art can be prevented.

Second Preferred Embodiment

In the manufacturing method according to the second preferred embodiment of the present invention, after the first pattern is formed in the photoresist provided on the hard mask layer, the photoresist is shrank. Thereafter, the resist pattern after shrinkage is used as a mask to form the first pattern in the hard mask layer. Then the hard mask layer is patterned with the second pattern, to define circuit pattern therein.

Figure 24:
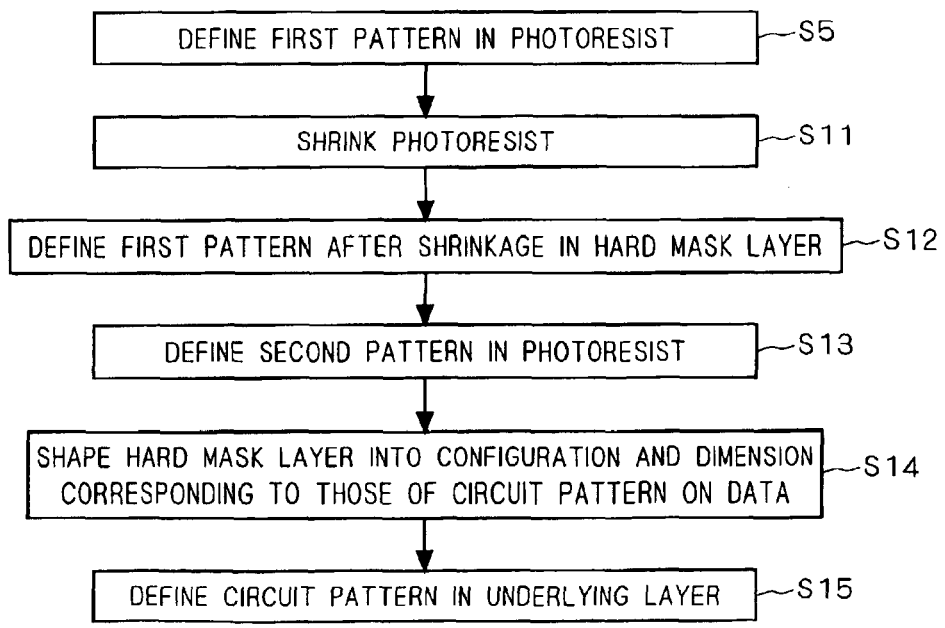
FIG. 24 is a flow chart showing the process flow of a manufacturing method according to a second preferred embodiment of the present invention.

With reference to the flow chart shown in FIG. 24, the process flow of the manufacturing method of the second preferred embodiment will be described in detail. Steps S1 through S5 in the flow chart of FIG. 1 described in the first preferred embodiment are also followed in the second preferred embodiment, so the description thereof is omitted here.

After step S5 (first lithography process), the photoresist patterned with the first pattern undergoes shrinkage using the process such as ion implantation, EB cure, UV cure, high temperature bake, isotropic etching, or the like (step S11).

Next, using the photoresist after shrinkage as a mask, anisotropic etching is performed. As a result, the first pattern after shrinkage is formed in the hard mask layer provided under the photoresist (step S12).

Subsequently, another photoresist is provided to cover the hard mask layer including the shrank first pattern therein. Then the second lithography process is performed through the second reticle, to form the second pattern in this photoresist (step S13).

Next, using the photoresist patterned with the second pattern as a mask, anisotropic etching is performed, whereby the second pattern is defined in the hard mask layer provided under the photoresist. The resultant configuration and dimension of the hard mask layer are corresponding to those of the circuit pattern on data (step S14).

The last step is etching using the hard mask layer including the circuit pattern therein as a mask, to form the circuit pattern in the underlying layer (step S15).

The process flow of the manufacturing method of the second preferred embodiment is as given above. By way of example, a gate electrode of a transistor is formed by the manufacturing method of the second preferred embodiment, the detail of which will be described.

First, using the first reticle and a stepper, the first pattern is formed in the photoresist 8 by the first lithography process (step S5, FIGS. 11 and 12).

Next, the photoresist 8 patterned with the first pattern is shrank by the process such as ion implantation, EB cure, UV cure, high temperature bake, isotropic etching, or the like (step S11).

Figure 25:
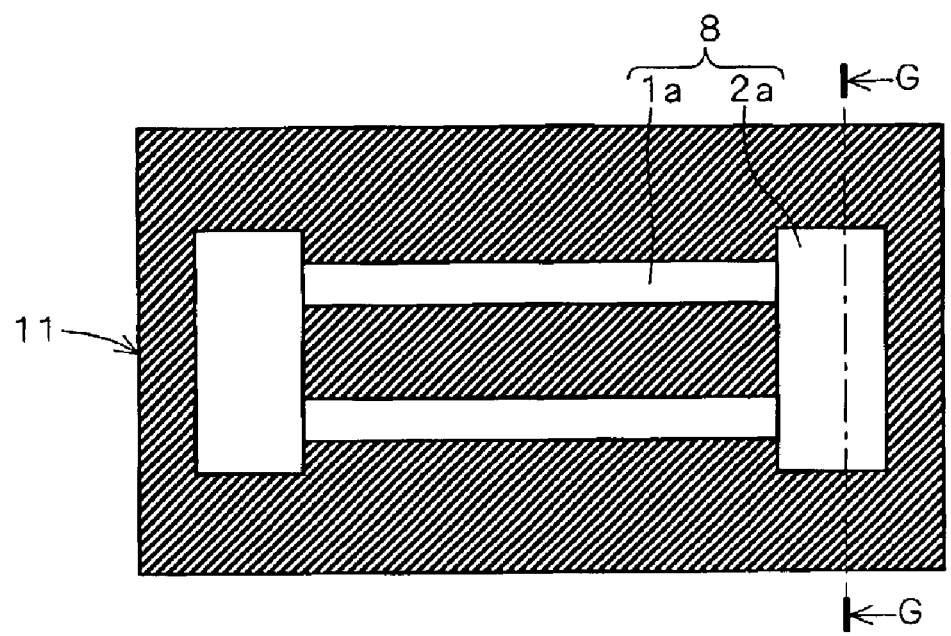
FIG. 25 is a plan view illustrating the photoresist patterned with the first pattern after shrinkage.
Figure 26:
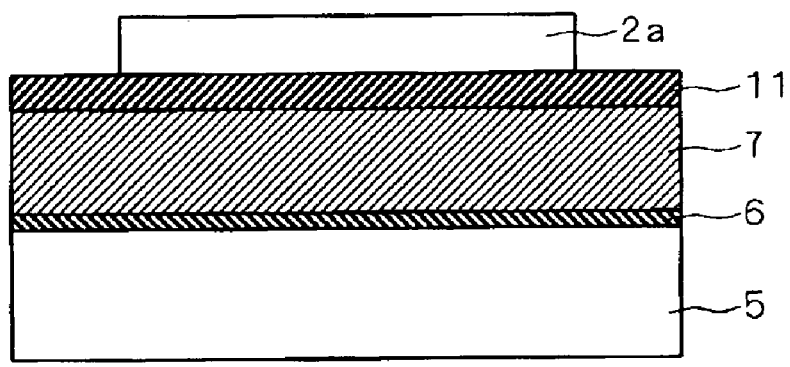
FIG. 26 is a cross-sectional view illustrating the photoresist patterned with the first pattern after shrinkage.

FIG. 25 is a plan view of the electronic device at this stage. A cross section thereof taken along a cutting line G—G in FIG. 25 is illustrated in FIG. 26. In the second preferred embodiment, there is no shrinkage process of the hard mask layer 11. In contrast to the first preferred embodiment, the amount of shrinkage of the hard mask layer 11 can be ignored accordingly. As a result, the thickness of the hard mask layer 11 may be small.

By way of example, the photoresist 8 may be shrank by ion implantation, the detail of which is as follows.

When Ar ions are implanted in vacuum into a 150-nm-sized KrF photoresist with a dose of $1 \times 10^{16}$ ions/cm$^2$ at an acceleration voltage of 50 keV, the photoresist is shrank to about 100 nm.

When a 100-nm-sized typical acrylic photoresist is employed, alternatively, it is shrank to about 60 nm under the same conditions.

When EB cure is employed, the detail of shrinkage of the photoresist 8 is as follows. A typical acrylic ArF photoresist may be used to be subjected to electron beam irradiation in vacuum with a dose of 2000 $\mu$C/cm$^2$ at an acceleration voltage of 4 keV, for example. As a result, the photoresist is shrank by about 5%.

When UV cure is employed, the detail of shrinkage of the photoresist 8 is as follows. By way of example, a typical acrylic ArF resist is used. While keeping the resist at a temperature of about 110° C., deep ultraviolet (DUV) radiation of wavelength from 200 to 300 nm is performed on this resist for 40 seconds, for example. As a result, the photoresist is shrank by about 5%.

When high temperature bake is employed, the detail of shrinkage of the photoresist 8 is as follows. A typical acrylic ArF photoresist may be mounted on a hot plate, which thereafter undergoes bake under temperature of about 170° C. for 120 seconds, for example. As a result, the photoresist is shrank by about 5%.

After step S11, using the photoresist 8 after shrinkage as a mask, anisotropic etching is performed. As a result, the first pattern after shrinkage is formed in the hard mask layer 11 provided under the photoresist 8 (step S12).

FIG. 15 is a plan view of the electronic device at this stage. A cross section thereof is illustrated in FIG. 16.

Subsequently, steps S13 through S15 follow. As these steps are the same as steps S8 through S10 in the first preferred embodiment, respectively, the detailed description thereof is omitted here.

Similar to the first preferred embodiment, the hard mask layer 11 is also provided on the underlying layer (gate electrode layer) 7 in the second preferred embodiment as described. It is thus allowed to employ the first and second lithography processes. Further, these lithography processes are performed under the conditions specialized for the fine pattern feature and fine space, respectively. Therefore, the dimensions of the fine pattern feature and of the fine space can be smaller than those defined under the limitations of the trade-off in the background art. As a result, shrinkage of the circuit pattern as a whole is allowed, leading to improvement in integration of the device.

Further, in the second preferred embodiment, the photoresist 8 is shrank after the first lithography process, and thereafter, the merged pattern features 1a for gate electrode and the merged pattern features 2a for pad are defined in the hard mask layer 11 using the photoresist 8 after shrinkage as a mask. Then the second lithography process follows. Therefore, shrinkage of the merged pattern features 1a and 2a causes no effect on the fine spaces 3 and 4 between the pattern features. As a result, expansion of the fine spaces 3 and 4 can be prevented, leading to shrinkage of the circuit pattern as a whole and eventually, leading to improvement in integration of the device.

Still further, resulting from the shrinkage using the process such as ion implantation, EB cure, UV cure, or high temperature bake, the property of the photoresist 8 is altered. Namely, tolerance thereof to etching can be improved.

Third Preferred Embodiment

The manufacturing method according to the third preferred embodiment of the present invention is the combination of the first and second preferred embodiments. In the third preferred embodiment, after the first pattern is formed in the photoresist provided on the hard mask layer, the photoresist is shrank. Thereafter, using the photoresist after shrinkage as a mask, the first pattern is formed in the hard mask layer. Next, the hard mask layer patterned with the first pattern is also shrank, and thereafter, the second pattern is formed in the hard mask layer after shrinkage.

Figure 27:
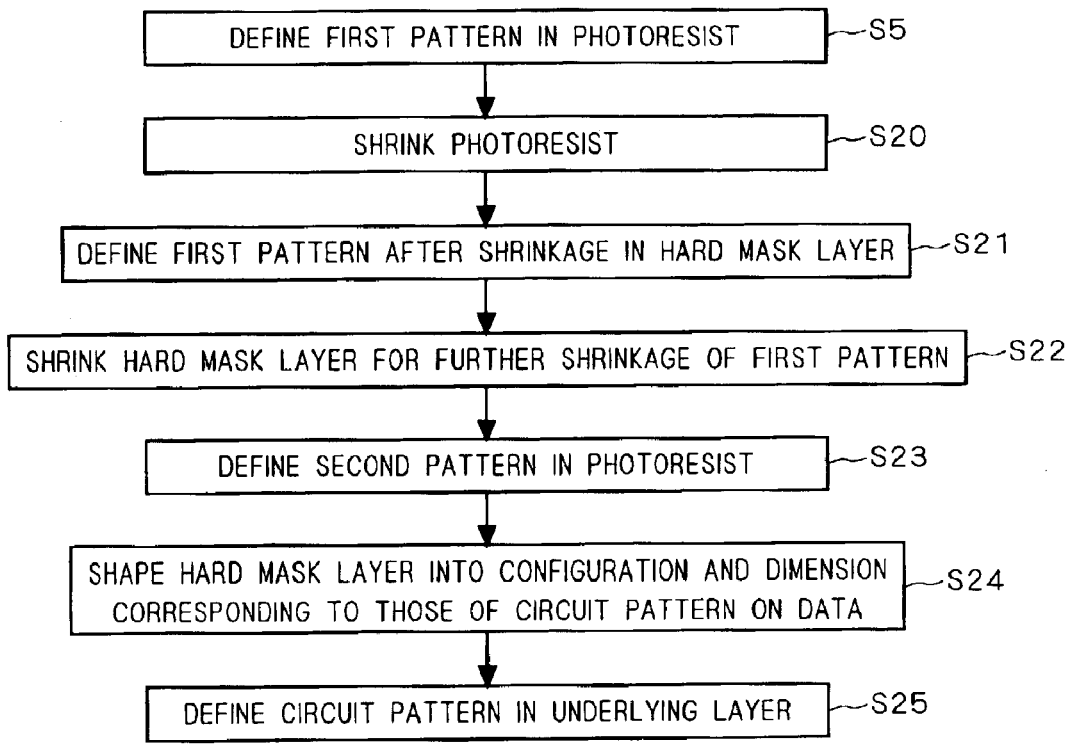
FIG. 27 is a flow chart showing the process flow of a manufacturing method according to a third preferred embodiment of the present invention.

The process flow of the manufacturing method of the third preferred embodiment will be described with reference to the flow chart shown in FIG. 27. Although omitted from the flow chart of FIG. 27, steps S1 through S4 in the flow chart of FIG. 1 described in the first preferred embodiment are also followed in the third preferred embodiment.

First, using the first reticle and a stepper, the first pattern including the merged pattern features 1a for gate electrode and the merged pattern features 2a for pad is formed in the photoresist 8 by the first lithography process (step S5, FIGS. 11 and 12).

After step S5 (first lithography process), the photoresist 8 patterned with the first pattern undergoes shrinkage using the process such as ion implantation, EB cure, UV cure, high temperature bake, isotropic etching, or the like (step S20).

Figure 28:
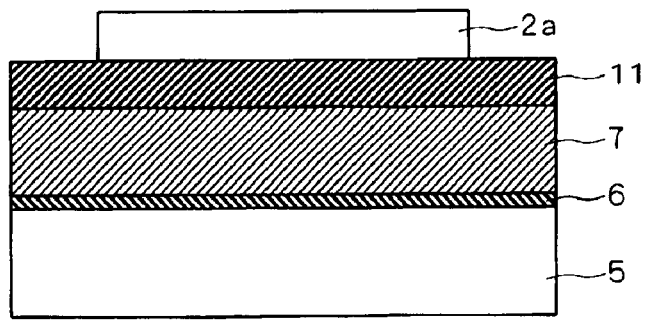
FIG. 28 is a cross-sectional view illustrating the photoresist after shrinkage.

FIG. 25 is a plan view of the electronic device at this stage. In the third preferred embodiment, the cross section thereof taken along the cutting line G—G in FIG. 25 is illustrated in FIG. 28. FIGS. 26 and 28 are different in that, in view of the shrinkage process to be performed at step S22, the hard mask layer 11 is defined to have a larger thickness in FIG. 28.

Next, using the photoresist 8 after shrinkage as a mask, anisotropic etching is performed. As a result, the first pattern after shrinkage is formed in the hard mask layer 11 provided under the photoresist 8 (step S21).

Figure 29:
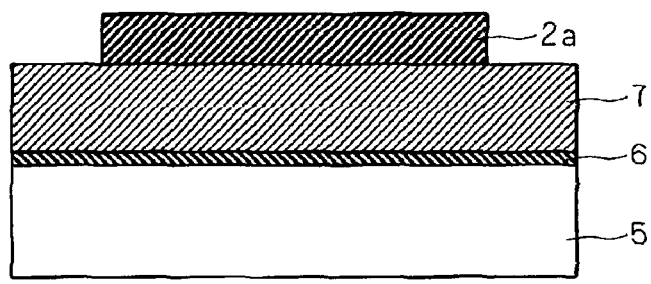
FIG. 29 is a cross-sectional view illustrating the hard mask layer patterned with the first pattern after first shrinkage.

FIG. 15 is a plan view of the electronic device after removal of the photoresist 8. In the third preferred embodiment, the cross section thereof taken along the cutting line C—C in FIG. 15 is illustrated in FIG. 29. As discussed, FIGS. 16 and 29 are different in that, in view of the shrinkage process to be performed at step S22, the hard mask layer 11 is defined to have a larger thickness in FIG. 29.

Thereafter, isotropic etching is performed to shrink the hard mask layer 11 including the shrank fist pattern therein, whereby the first pattern is further shrank (step S22).

Figure 30:
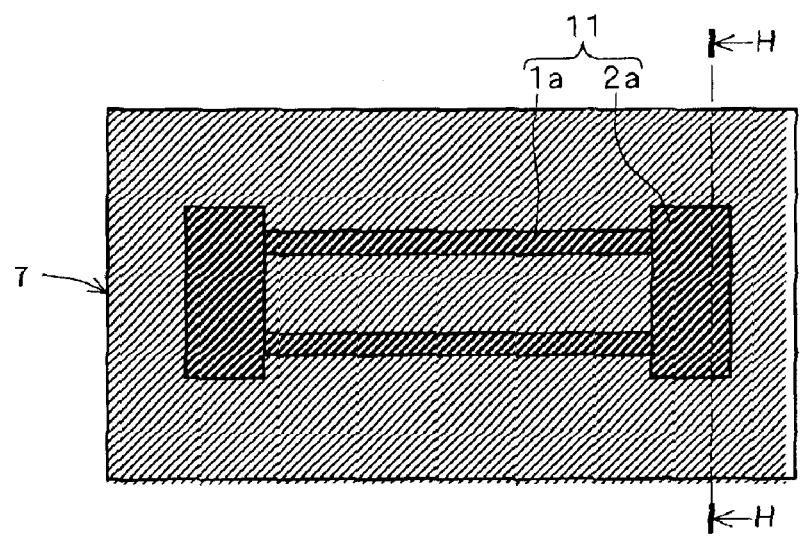
FIG. 30 is a plan view illustrating the hard mask layer patterned with the first pattern after second shrinkage.
Figure 31:
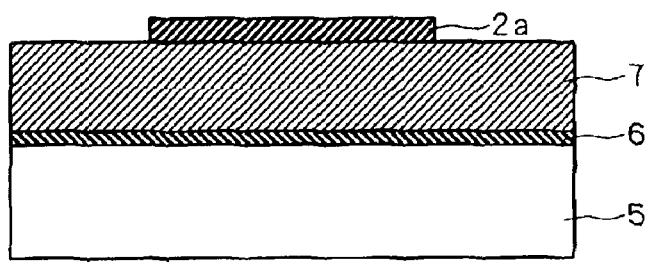
FIG. 31 is a cross-sectional view illustrating the hard mask layer patterned with the first pattern after second shrinkage.

FIG. 30 is a plan view of the electronic device at this stage. A cross section thereof taken along a cutting line H—H in FIG. 30 is illustrated in FIG. 31. As shown in FIGS. 30 and 31, resulting from isotropic etching performed in step S22, the hard mask layer 11 is isotropically shrank in all directions.

Next, another photoresist 18 is provided to cover the hard mask layer 11 after shrinkage. Using a stepper, the second lithography process is thereafter performed through the second reticle. As a result, the second pattern including the fine spaces 3a and 4a is formed in the photoresist 18 (step S23).

Figure 32:
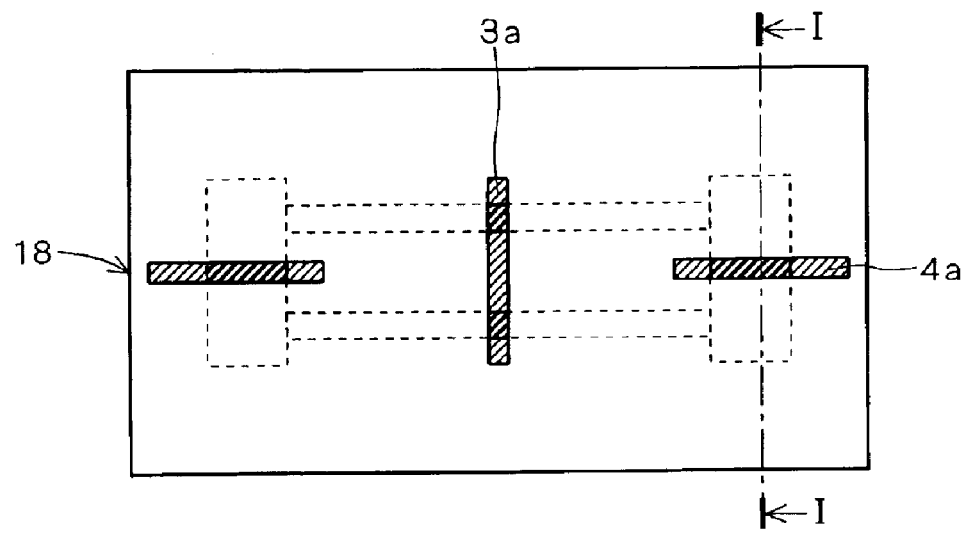
FIG. 32 is a plan view illustrating the photoresist patterned with the second pattern.
Figure 33:
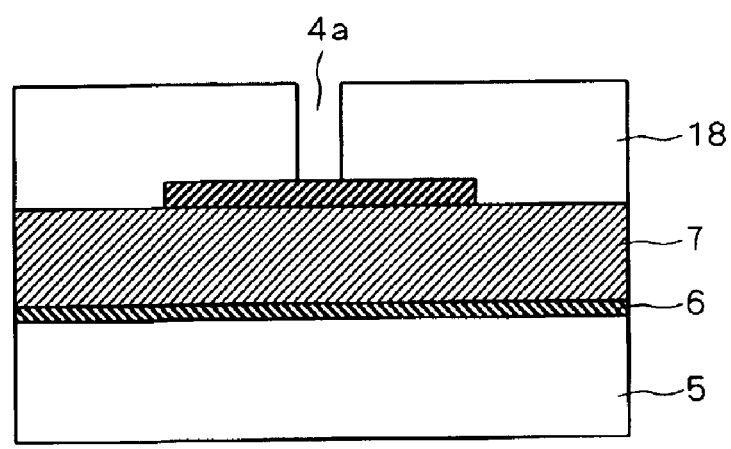
FIG. 33 is a cross-sectional view illustrating the photoresist patterned with the second pattern.

FIG. 32 is a plan view of the electronic device at this stage. A cross section thereof taken along a cutting line I—I in FIG. 32 is illustrated in FIG. 33. Dotted lines in FIG. 32 represent the hard mask layer 11 patterned with the first pattern after shrinkage process performed twice.

Using the photoresist 18 patterned with the second pattern as a mask, etching process follows, whereby the second pattern is formed in the hard mask layer 11 provided under the photoresist 18. The resultant configuration and dimension of the hard mask layer 11 are corresponding to those of the circuit pattern on data (step S24).

Figure 34:
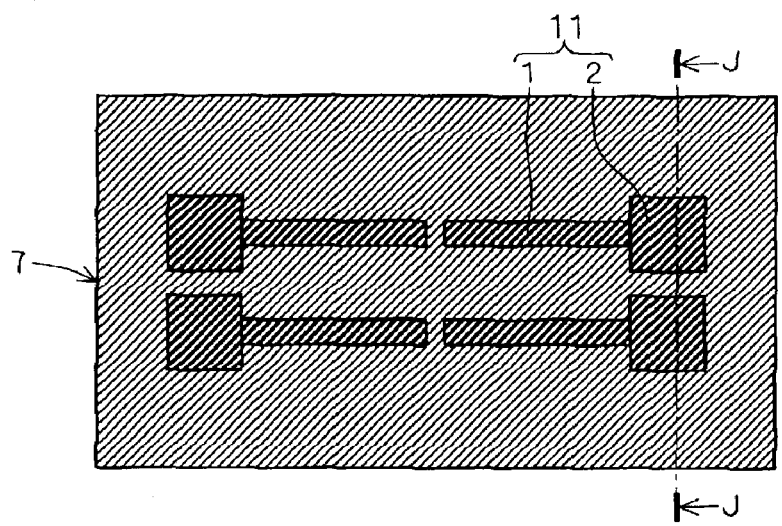
FIG. 34 is a plan view illustrating the hard mask layer patterned with the circuit pattern.
Figure 35:
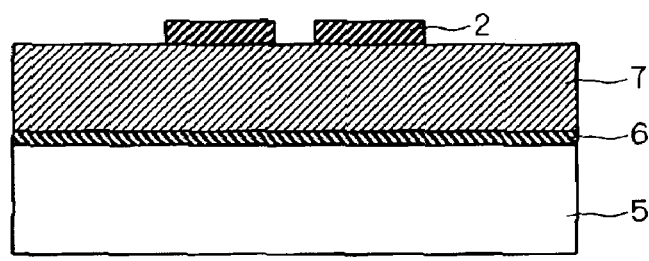
FIG. 35 is a cross-sectional view illustrating the hard mask layer patterned with the circuit pattern.

FIG. 34 is a plan view of the electronic device at this stage. A cross section thereof taken along a cutting line J—J in FIG. 34 is illustrated in FIG. 35.

The last step is etching using the hard mask layer 11 including the circuit pattern therein as a mask, to form the circuit pattern in the underlying layer 7 (step S25).

Figure 36:
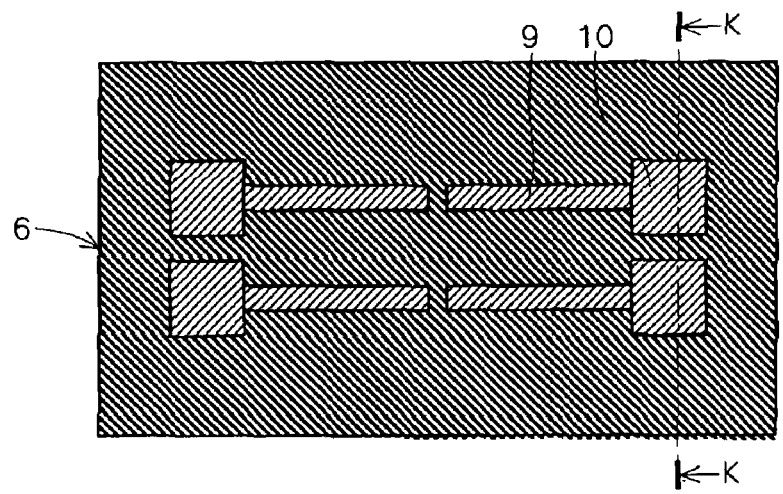
FIG. 36 is a plan view illustrating the completed circuit pattern.
Figure 37:
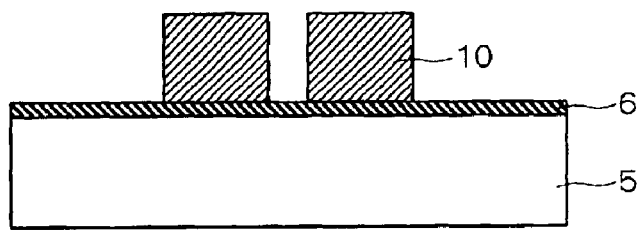
FIG. 37 is a cross-sectional view illustrating the structure of an electronic device patterned with the circuit pattern.
Figure 38:
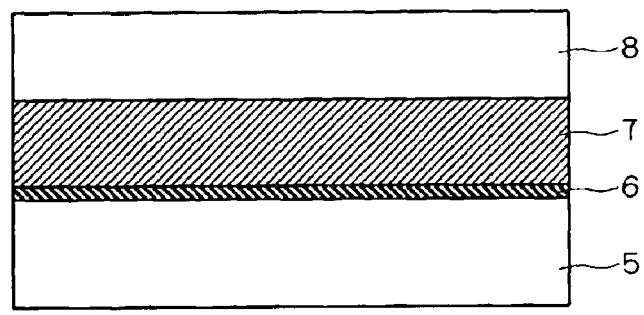
FIG. 38 is a cross-sectional view illustrating an electronic device to be subjected to the first shrinkage technique.
Figure 39:
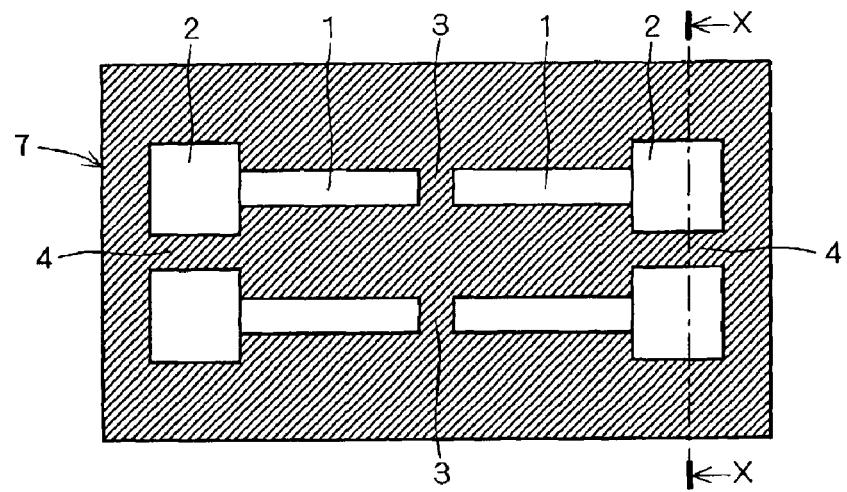
FIG. 39 is a plan view illustrating the photoresist patterned with the circuit pattern.
Figure 40:
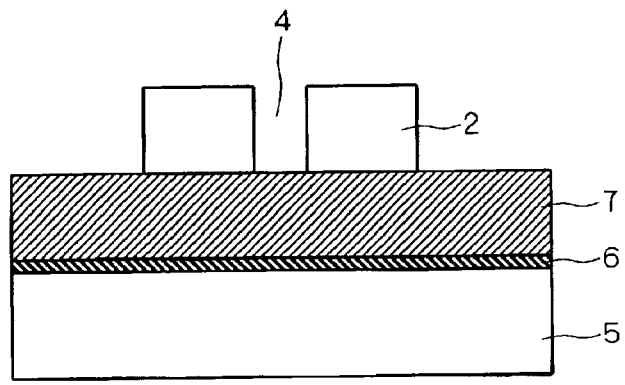
FIG. 40 is a cross-sectional view illustrating the photoresist patterned with the circuit pattern.
Figure 41:
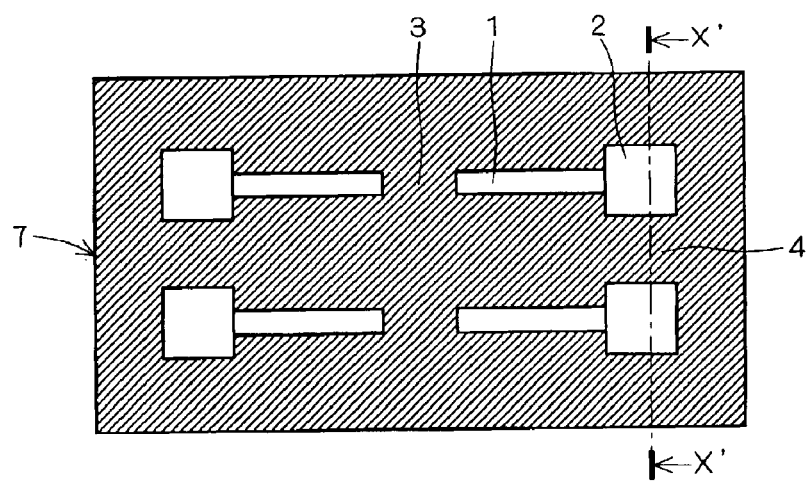
FIG. 41 is a plan view illustrating the photoresist patterned with the circuit pattern after shrinkage.
Figure 42:
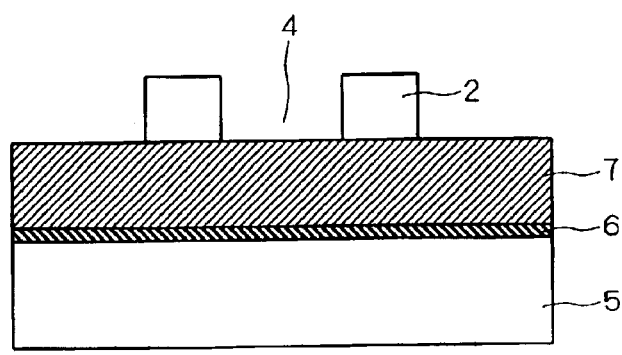
FIG. 42 is a cross-sectional view illustrating the photoresist patterned with the circuit pattern after shrinkage.
Figure 43:
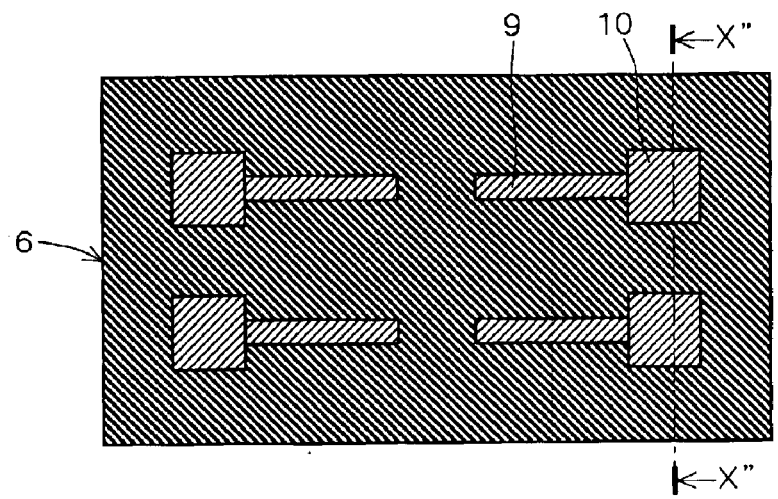
FIG. 43 is a plan view illustrating the electronic device patterned with the circuit pattern after shrinkage.
Figure 44:
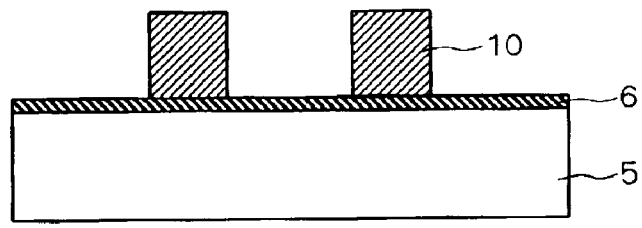
FIG. 44 is a cross-sectional view illustrating the electronic device patterned with the circuit pattern after shrinkage.
Figure 45:
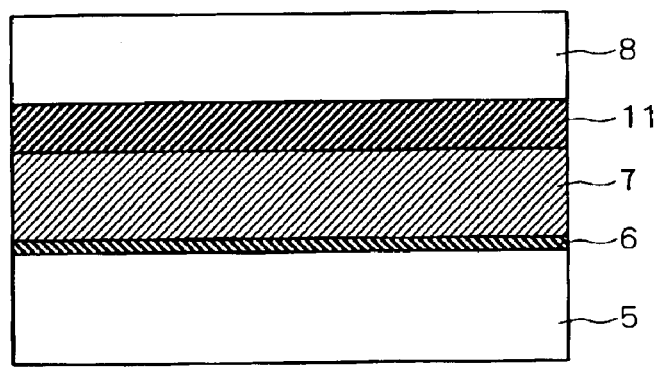
FIG. 45 is a cross-sectional view illustrating an electronic device to be subjected to the second shrinkage technique.
Figure 46:
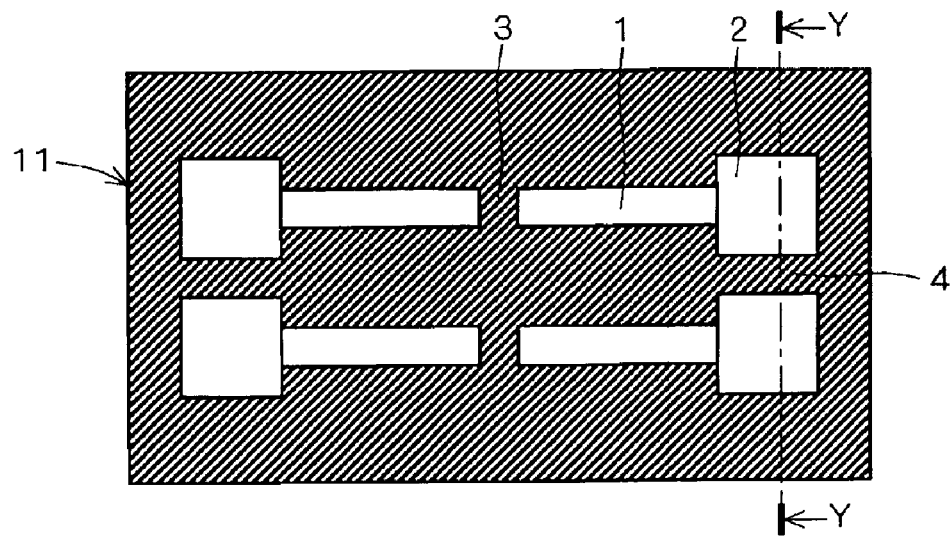
FIG. 46 is a plan view illustrating the photoresist patterned with the circuit pattern.
Figure 47:
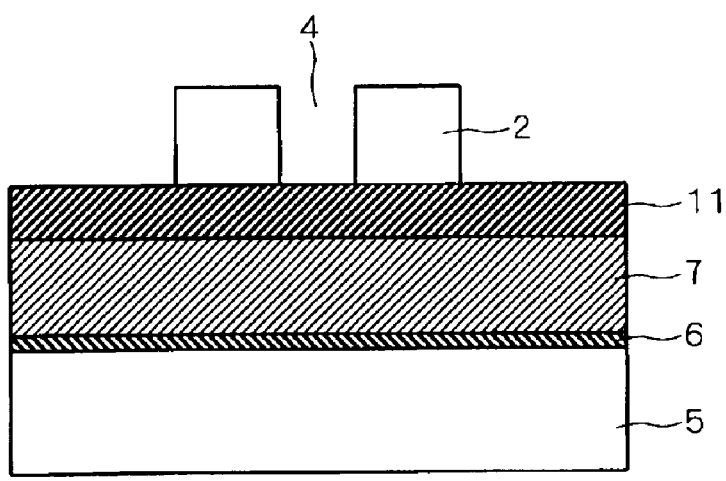
FIG. 47 is a cross-sectional view illustrating the photoresist patterned with the circuit pattern.
Figure 48:
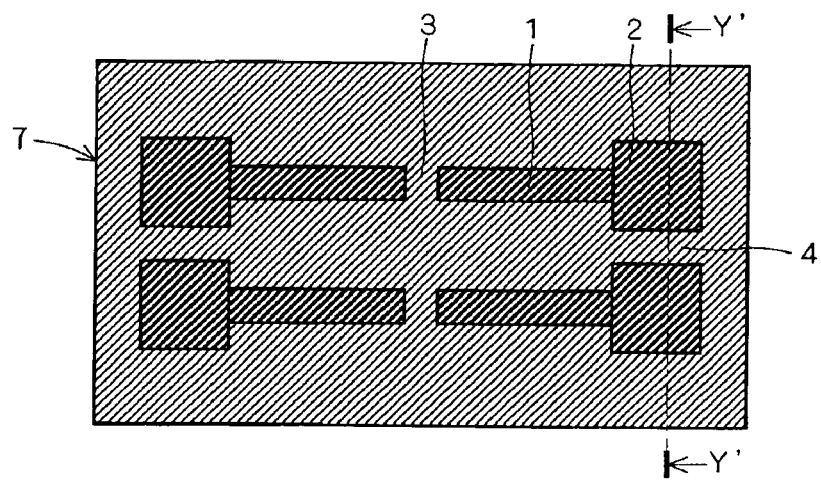
FIG. 48 is a plan view illustrating the hard mask layer patterned with the circuit pattern.
Figure 49:
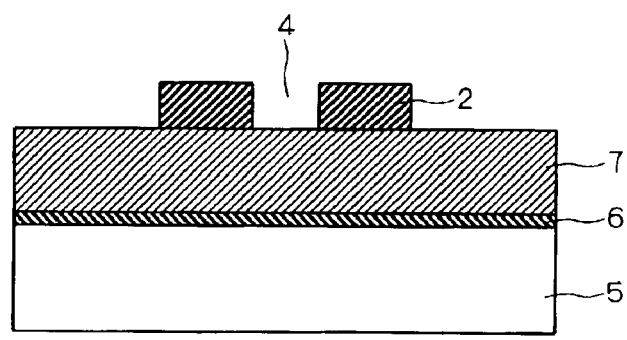
FIG. 49 is a cross-sectional view illustrating the hard mask layer patterned with the circuit pattern.
Figure 50:
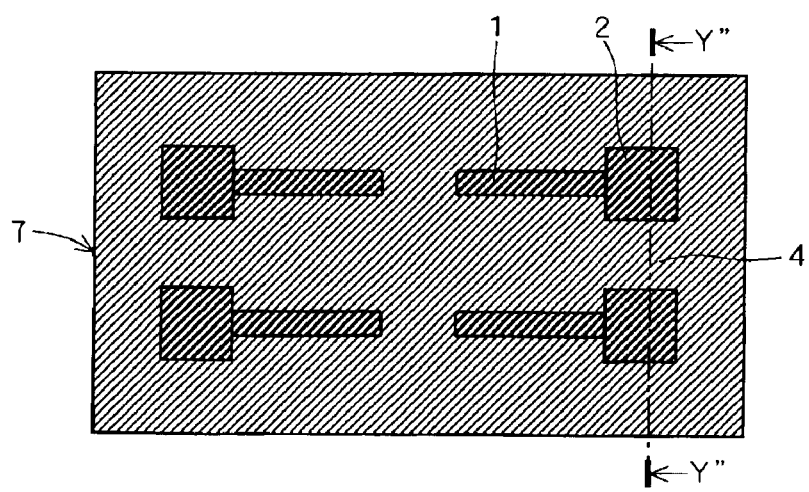
FIG. 50 is a plan view illustrating the hard mask layer after shrinkage.
Figure 51:
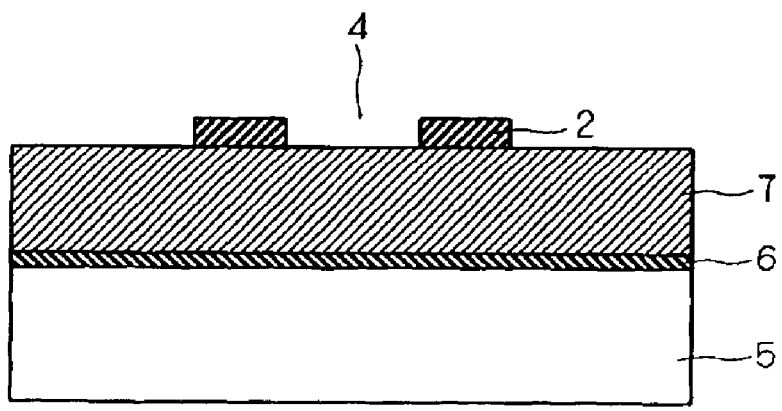
FIG. 51 is a cross-sectional view illustrating the hard mask layer after shrinkage.

FIG. 36 is a plan view of the electronic device at this stage. A cross section thereof taken along a cutting line K—K in FIG. 36 is illustrated in FIG. 37.

The processes of the steps in the third preferred embodiment are the same as those in the first and second preferred embodiments, and therefore, the detailed description thereof is omitted here.

Following the steps described so far, the circuit pattern is formed. Similar to the first and second preferred embodiments, the hard mask layer 11 is also provided on the underlying layer (gate electrode layer) 7. Therefore, the first and second lithography processes can be performed as well. Further, these lithography processes are performed under the conditions specialized for the fine pattern feature and fine space, respectively. Therefore, the dimensions of the fine pattern feature and of the fine space can be smaller than those defined under the limitations of the trade-off in the background art. As a result, shrinkage of the circuit pattern as a whole is allowed, leading to improvement in integration of the device.

Still further, in the third preferred embodiment, the photoresist 8 is shrank after the first lithography process, and thereafter, using the shrank photoresist 8 as a mask, the merged pattern features 1a for gate electrode and the merged pattern features 2a for pad are defined in the hard mask layer 11. The shrinkage process is further performed to shrink the hard mask layer 11, followed by the second lithography process. As a result, without causing expansion of the fine spaces 3 and 4, the pattern features such as the one for gate electrode can be smaller than those obtained in the first and second preferred embodiments.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing an electronic device for defining first and second circuit patterns separated by space, said method comprising the steps of:

(a) providing a hard mask layer on an underlying layer;

(b) forming a first cover pattern in said hard mask layer, said first cover pattern configured to cover a region defining said first and second circuit patterns, said first cover pattern further configured to cover a region for defining said space;

(c) after said step (b), omnidirectionally reducing in size said hard mask layer;

(d) after said step (c), forming a second cover pattern in said hard mask layer, said second cover pattern configured to cover said region for defining said first and second circuit patterns, while exposing said underlying layer in said region for defining said space; and (e) after said step (d), defining said first and second circuit patterns in said underlying layer using said hard mask layer as a mask.

2. The method according to claim 1, wherein said step (b) comprises the steps of:
(b-1) providing a photoresist on said hard mask layer;
(b-2) patterning said photoresist based on said first cover pattern;
(b-3) after said step (b-2), shrinking said photoresist; and
(b-4) patterning said hard mask layer using said photoresist after shrinkage as a mask.

3. The method according to claim 2, wherein said step (b-3) is performed by ion implantation, electron beam cure, ultraviolet cure, or heat temperature bake.

* * * * *